United States Patent

Suematsu et al.

[11] Patent Number: 6,046,955
[45] Date of Patent: Apr. 4, 2000

[54] SEMICONDUCTOR MEMORY DEVICE WITH TESTABLE SPARE COLUMNS AND ROWS

[75] Inventors: Yasuhiro Suematsu; Shigeo Ohshima, both of Yokohama, Japan

[73] Assignee: Kabushiki Kaisha Toshiba, Kawasaki, Japan

[21] Appl. No.: 09/271,468

[22] Filed: Mar. 17, 1999

[30] Foreign Application Priority Data

Mar. 30, 1998 [JP] Japan .................................. 10-083644

[51] Int. Cl.⁷ ...................................................... G11C 8/00
[52] U.S. Cl. ............................. 365/230.03; 365/230.06
[58] Field of Search ........................... 365/230.03, 230.06

[56] References Cited

U.S. PATENT DOCUMENTS 5,379,259  1/1995  Fujita ...................................... 365/200
5,740,119  4/1998  Asakura et al. ..................... 365/230.03

FOREIGN PATENT DOCUMENTS 08293199  5/1996  Japan .............................. G11C 29/00
 9147551  6/1997  Japan .............................. G11C 11/34

Primary Examiner—David Nelms
Assistant Examiner—M. Tran
Attorney, Agent, or Firm—Loeb & Loeb. LLP

[57] ABSTRACT

A synchronous dynamic random access memory has spare columns which can be tested before shipping. In the memory, a mode set register outputs a multibank write signal in the test mode. A CBS latch circuit generates not only a signal for selecting the spare column decoders in banks and in the test mode but also signals for selecting the column decoders. Write driving circuits write the data onto the column lines selected by the column decoders and onto the spare column lines selected by the spare column decoders.

14 Claims, 6 Drawing Sheets

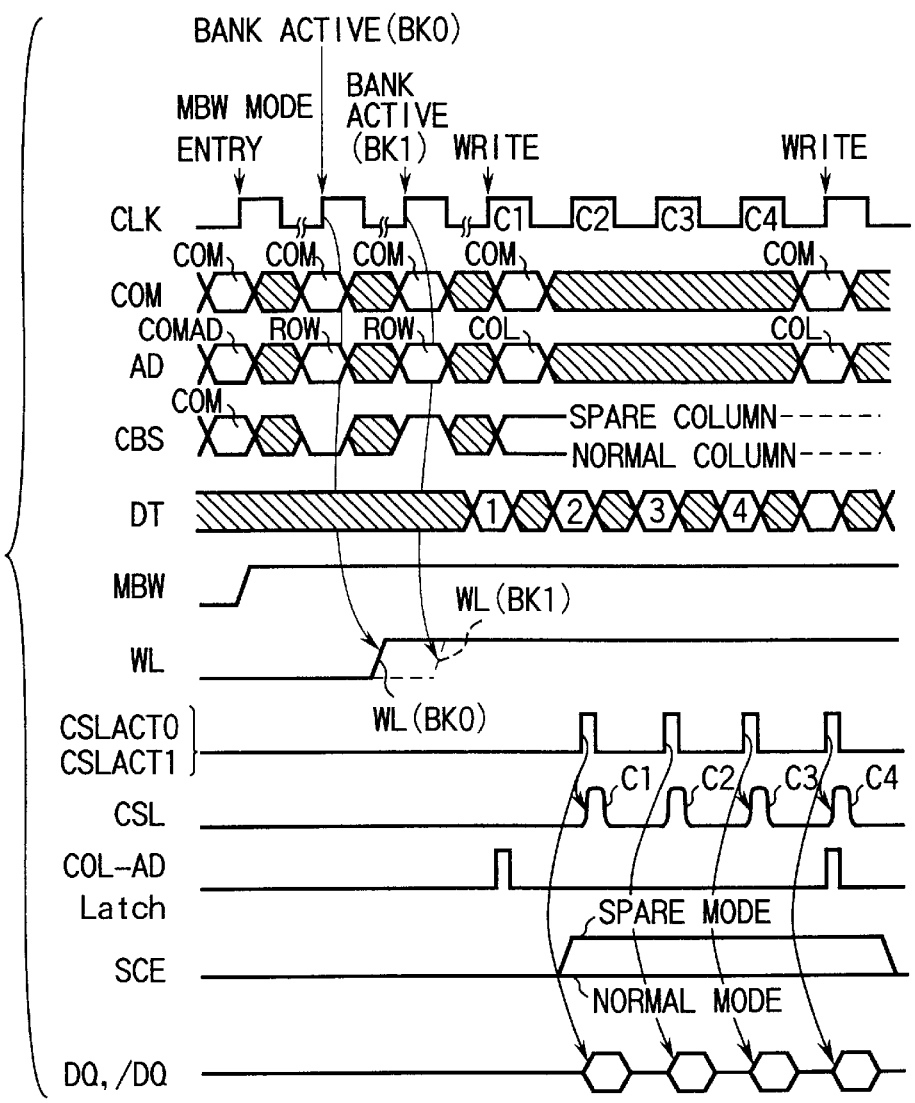
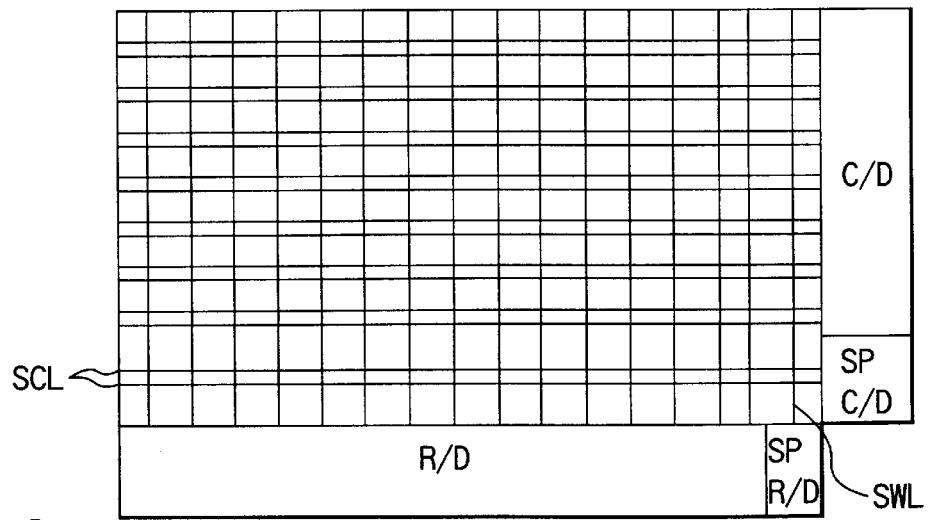
FIG. 7
FIG. 8

SEMICONDUCTOR MEMORY DEVICE WITH TESTABLE SPARE COLUMNS AND ROWS

BACKGROUND OF THE INVENTION

This invention relates to a semiconductor memory device with banks, such as a synchronous dynamic random-access memory (hereinafter, referred to as a synchronous DRAM).

After the manufacture of semiconductor memory devices, the function of their memory cells are generally tested and only good products are shipped. In recent years, semiconductor memory devices have been stepped up in storage capacity and the time required to test memory cells has increased. In testing memory cells, all "1" data or all "0" data is written into the memory cell array. Then, the written data is read out to check whether the data has been written into each memory cell properly. Therefore, when a memory to be tested has a large storage capacity, the time required to write the data into or read out the data from the memory cells is long, leading to a decrease in the throughput.

For example, to carry out the test on a semiconductor memory device with banks, such as a synchronous DRAM, the data write operation is conducted for each bank. Specifically, in the case of, for example, a synchronous DRAM with two banks, a bank select signal is used to select a first and then second bank. With the first word lines of the first and second banks being activated, the column lines of the first bank are selected sequentially and the data is written into the memory cells selected by the first word lines and the column lines in the first bank. Then, the column lines of the second bank are selected sequentially and the data is written into the memory cells selected by the first word lines and column lines in the second bank. Thereafter, the second word lines of the first and second banks are selected sequentially and the above operation is repeated. By repeating the operation on subsequent word lines of the first and second banks, the data is written into all the memory cells in the first and second banks. For this reason, testing the memory takes a long time because the data have to be written into the memory cells in the above manner. Therefore, the larger the number of banks, the longer time the testing needs.

To overcome this drawback, the technique for shortening the testing time has been developed. For example, Jpn. Pat. Appln. KOKAI Publication No. 9-147551 disclosed a technique for shortening the testing time by selecting plural banks simultaneously in the test mode and writing the data into the selected plural banks simultaneously.

In the prior art, only ordinary memory cell arrays have been tested but the spare cells constituting the redundancy circuit have not been tested. Semiconductor memory devices generally have spare rows or spare columns. According to the result of testing only normal cell arrays, it is found that there are a defective row or column, the defective row or column is replaced with a spare row or column. If the spare row or column to be replaced has a defect, the defective row or column is replaced with the defective spare row or column, and thus the defect cannot be relieved, failing to improve the yield. Therefore, in large-capacity semiconductor memory devices, it is important to test the spare cells beforehand. In the prior-art semiconductor memory devices, however, the spare cells have not been tested.

Further, in a conventional technique for selecting plural banks simultaneously in the test mode and for writing the data into the selected plural banks simultaneously, it may be that, for example, a command to activate a bank will be lost and a certain bank be not activated. In the prior art, even when such an inactivated bank is present, the write driving circuit corresponding to the inactivated bank operates to write the data into the inactivated bank, which may lead to an increase in the drawn current.

It is, accordingly, an object of the present invention to overcome the disadvantages by providing a semiconductor memory device capable of not only testing the spare cells to improve the yield but also shortening the testing time by testing plural banks simultaneously with a smaller drawn current.

BRIEF SUMMARY OF THE INVENTION

The foregoing object is accomplished by providing a semiconductor memory device comprising: a memory cell array including word lines, column lines, and at least one spare column line; a row decoder for selecting the word lines according to a row address; a column decoder for selecting the column lines according to a column address; banks each including a spare column decoder for selecting the spare column line; first generating means for generating a write control signal for bringing the banks into a writing state simultaneously according to a signal for setting a test mode; second generating means for not only latching a bank select signal included in the column address in the test mode and generating a first select signal for selecting the spare column decoders of all the banks, but also generating a second select signal for selecting all the column decoders of all the banks according to the write control signal supplied from the first generating means; and a write driving circuit for writing data onto the column lines selected according to the column address by the column decoders selected by the second selected signal supplied from the second generating means and further writing data onto the spare column lines via the spare column decoders selected by the first select signal supplied from the second generating means.

The write driving circuit includes a control circuit which deactivates the write driving circuit when the bank select signal included in the row address indicates an unselected state in the test mode.

The control circuit includes: a clocked inverter circuit to which the bank select signal is supplied and which is activated according to the write control signal; a transistor which is connected to the output terminal of the clocked inverter circuit and sets the output terminal of the clocked inverter circuit at one logic level when the write control signal is inactive; and a logic circuit which is connected to the output terminal of the clocked inverter circuit and controls the taking in of the data according to the logic level of the output terminal of the clocked inverter circuit.

The write driving circuit is shared by two adjacent banks.

The spare column decoder includes a select circuit which is activated according to the write control signal supplied from the first generating means and selects a spare column according to the first select signal supplied from the second generating means.

The first generating means deactivates the write control signal for bringing the banks into the writing state simultaneously according to a signal for ending the test mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a timing chart illustrating the operation in the test mode of FIG. 1;

FIG. 8 is a plan view to explain the way of selecting a spare row; and

DETAILED DESCRIPTION OF THE INVENTION

Hereinafter, referring to the accompanying drawings, an embodiment of the present invention will be explained.

Figure 2A:
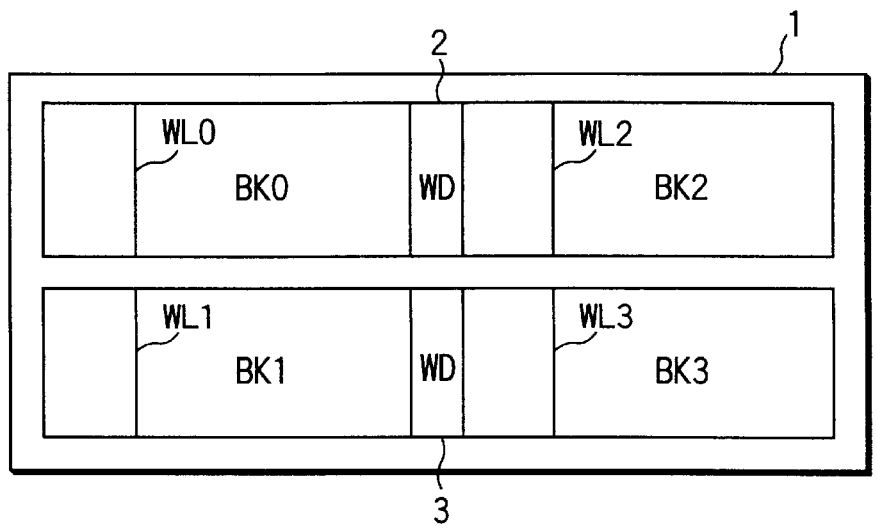
FIG. 2A is a schematic plan view illustrating the operation in the test mode.
Figure 2B:
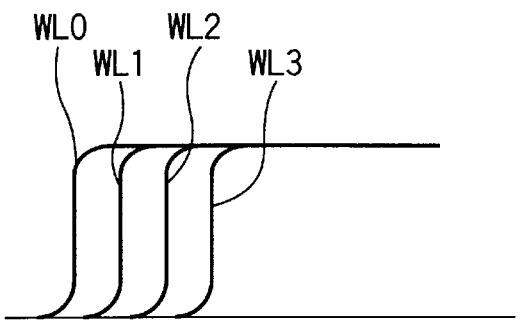
FIG. 2B is a timing diagram illustrating the operation in the test mode.

The principle of the present invention will be explained by reference to FIGS. 2A and 2B. FIG. 2A shows a synchronous DRAM of, for example, a four-bank structure. In a chip 1, banks BK0, BK1, BK2, and BK3 are provided. Each bank includes a memory cell array, a row decoder, a column decoder, and a spare column decoder (not shown), which will be explained later. A write driving circuit (WD) 2 is provided between bank BK0 and bank BK2 and a write driving circuit (WD) 3 is provided between bank BK1 and bank BK3. According to the present invention, the write driving circuits 2, 3 may be shared by the adjacent banks or provided for each bank.

With this configuration, in the test mode, word lines WL0, WL1, WL2, and WL3 of the respective banks BK0, BK1, BK2, and BK3 are activated sequentially according to a bank active command provided from an outer source (not shown). Thereafter, a corresponding column line (not shown) in each of the banks BK0, BK1, BK2, and BK3 is selected simultaneously. The data is written into memory cells selected by the column lines and the word lines. Then, the corresponding column lines in each bank are selected in sequence and the data is written in each bank. After all the column lines have been selected and the data has been written, the next word line is selected and the operation as descried above is repeated. Additionally, with the invention, in the test mode, a spare column line is also selected and the data is written. In this way, the data is written simultaneously into the four-bank memory cell array.

Figure 1:
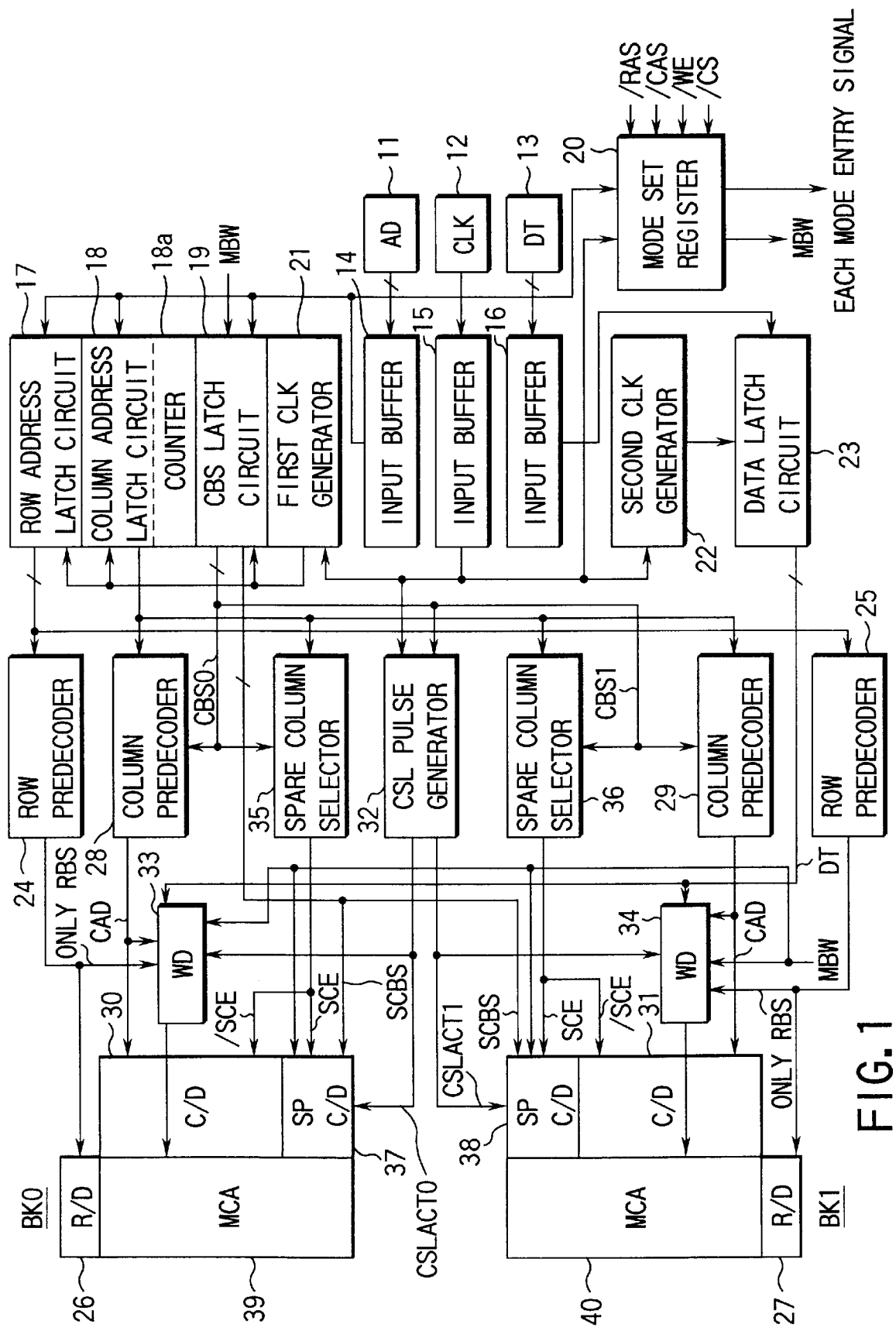
FIG. 1 relates to an embodiment of the present invention and shows the configuration of the main part of the embodiment.

FIG. 1 shows a configuration related to bank BK0 and bank BK1 of FIG. 2A. In FIG. 1, only the configuration related to data writing is shown and the configuration related to data reading is omitted. Pads 11 to which an address signal AD is supplied, a pad 12 to which a clock signal CLK is supplied, and pads 13 to which data DT is supplied are connected to input buffers 14, 15, 16, respectively. There are provided as many pads 11 and input buffers 14 as the number of bits in the address signal. Similarly, there are provided as many pads 13 and input buffers 16 as the number of bits in the data. In FIG. 1, only one set of them is shown. The output terminal of the input buffer 14 is connected to a row address latch circuit 17, a column address latch circuit 18, a column-directional bank select signal latch circuit (hereinafter, referred to as a CBS latch circuit) 19, and a mode set register 20. The row address latch circuit 17 latches the row address in the address signal. The column address latch circuit 18 latches the column address in the address signal AD. The column address latch circuit 18 has a counter 18a. The counter 18a increments the column address latched in the column address latch circuit 18.

The CBS latch circuit 19 latches a column-directional bank designation signal CBS set to, for example, the most-significant two bits in the column address signal. In a normal operation, the CBS latch circuit 19 outputs column-directional bank select signals CBS0, CBS1 (signals CBS0, CBS1 are complementary to each other in the normal mode) to select columns in each bank according to the column-directional bank designation signal CBS. In the test mode, explained later, the CBS latch circuit 19 places both of the column-directional bank select signals CBS0, CBS1 at the high level according to a multibank write signal MBW supplied from the mode set register 20. Furthermore, in the test mode, the CBS latch circuit 19 outputs a spare column bank select signal SCBS to select a spare column. The spare column bank select signal SCBS may be, for example, at the high level.

The output terminal of the input buffer 15 is connected to a first clock (CLK) generator 21, a second clock generator 22, a CSL pulse generator 32, and the mode set register 20. The first clock generator 21 generates a first internal clock signal according to the clock signal supplied from the input buffer 15 and supplies it to the row address latch circuit 17, column address latch circuit 18, and CBS latch circuit 19. The row address latch circuit 17, column address latch circuit 18, and CBS latch circuit 19 operate in synchronization with the first internal clock signal supplied from the first clock generator 21. According to the clock signal and the column-directional bank select signals CBS0, CBS1 supplied from the CBS latch circuit 19, the CSL pulse generator 32 generates timing signals CSLACT0, CSLACT1 to control the timing of activating a column select signal CSL. The timing signals CSLACT0, CSLACT1 are supplied to spare column decoder (SPC/D) 37, 38, column decoders (C/D) 30, 31, and write driving circuits 33, 34.

The second clock generator 22 generates a second internal clock signal according to the clock signal supplied from the input buffer 15 and supplies it to a data latch circuit 23. According to the second internal clock signal, the data latch circuit 23 latches the data supplied from the input buffers 16.

According to the clock signal supplied from the input buffer 15, the mode set register 20 takes in a address signal supplied from the input buffers 14, and the following signals supplied from external sources: a row address strobe signal /RAS (where/indicates the reversed signal); a column address strobe signal /CAS; a write enable signal /WE; and a chip select signal /CS, and decodes those signals. In the synchronous DRAM, the sequence of the signals makes it possible to set commands specifying various operation modes, including the bank active, write, and read modes. The mode set register 20 decodes the signals and outputs an entry signal for each operation mode. In addition, the mode set register 20 places a multibank write signal MBW to make banks writable simultaneously at the high level by receiving and decoding the sequence of the signals set arbitrarily for the test mode. The register 20 places the multibank write signal MBW at the low level by decoding the sequence of the signals for the test mode exit.

The output terminal of the row address latch circuit 17 is connected to row predecoders 24, 25 in said banks. These row predecoders 24, 25 predecode the row addresses supplied from the row address latch circuit 17 and supply the result to corresponding one of the row decoders (R/D) 26, 27. The most-significant bit of the signals output from the row predecoders 24, 25 may be assigned to a row-directional bank selection signal LBS, which is are supplied to write driving circuits (WD) 33, 34.

According to the column-directional bank select signals CBS0, CBS1 supplied form the CBS latch circuit 19, column predecoders 28, 29 predecode the column address supplied from the column address latch circuit 18 and supply the results to the column decoders 30, 31 in the each bank, respectively.

In a normal operation, according to the column-directional bank select signals CBS0, CBS1 supplied from the CBS latch circuit 19 and the column address supplied from the column address latch circuit 18, spare column selectors 35, 36 judge whether the column address has been replaced with the spare column address. If the column address has been replaced with the spare column address, the spare column selectors 35, 36 output spare column enable signals SCE to activate the spare column decoders (SPC/D) 37, 38 and signals /SCE to deactivate the column decoders (C/D) 30, 31, respectively.

The write driving circuits (WD) 33, 34 receive the data supplied from the data latch circuit 23, the bank select signal RBS supplied from the row predecoders 24, 25, the multibank write signal MBW supplied from the mode set register 20, the column address CAD output from the column predecoders 28, 29, and the timing signals CSLACT0, CSLACT1 supplied from the CSL pulse generator 32. In a data write operation, the write driving circuits 33, 34 transfer the write data to the data line pair (DQ, /DQ) in the selected bank.

In the individual banks BK0, BK1, the memory cell arrays (MCA) 39, 40 each include a plurality of memory cells and spare columns. The memory cells in the memory cell arrays 39, 40 are selectable by way of the row decoders (R/D) 26, 27 and column decoders (C/D) 30, 31. The spare columns are selectable by way of the spare column decoders (SPC/D) 37, 38.

Figure 3:
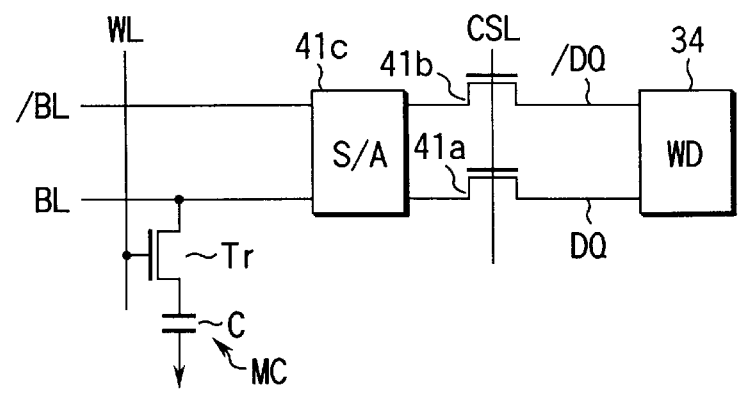
FIG. 3 is a circuit diagram illustrating the connection between a memory cell and a write driving circuit.

FIG. 3 shows the connection between the memory cell array 40 in bank BK1 of FIG. 1 and the write driving circuit 34. The configuration applies to the other banks and write driving circuits corresponding thereto. The write driving circuit may be provided for, for example, each bank. In the memory cell array 40, a memory cell MC is composed of a transistor Tr and a capacitor C. The gate of the transistor Tr is connected to a word line WL. One end of the current path is connected to the ground via the capacitor C and the other end is connected to a bit line BL. A memory cell (not shown) is connected to a bit line /BL. The bit lines BL, /BL are connected to one-side ends of the current paths of the transistors 41a, 41b via a sense amplifier (S/A) 41c, respectively. The column select signal CSL output from the column decoder is supplied to the gates of the transistors 41a, 41b. The other ends of the current paths of the transistors 41a, 41b are connected to the write driving circuit 34 via the data lines DQ, /DQ. The data lines DQ, /DQ are provided, for example, between subarrays (not shown) in the memory cell array. A plurality of bit lines are connected to the data lines DQ, /DQ according to the column select signal CSL. There are provided as many units of the write driving circuit 33 as the number of data line pairs DQ, /DQ.

FIG. 3 shows the configuration of normal columns. The spare columns have a similar configuration.

Figure 4:
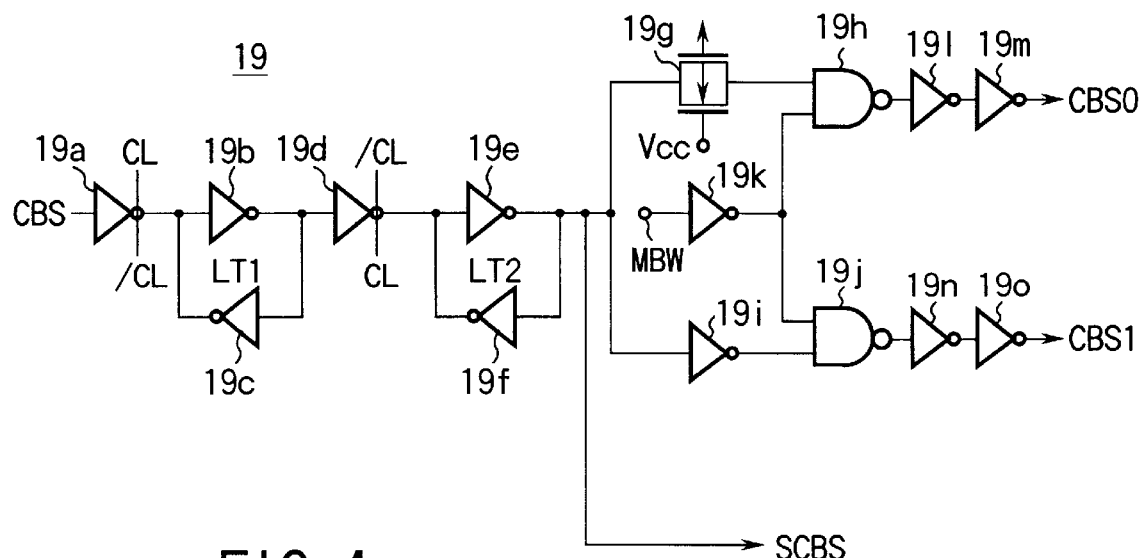
FIG. 4 is a circuit diagram of the CBS latch circuit of FIG. 1.

FIG. 4 shows the configuration of the CBS latch circuit 19. The column-directional bank designation signal CBS separated from signals from the input buffers 14 passes through a clocked inverter circuit 19a controlled by clock signals CL, /CL and is supplied to the input terminal of a latch circuit LT1. The latch circuit LT1 is composed of inverter circuits 19b, 19c. The output terminal of the latch circuit LT1 is connected to the input terminal of a latch circuit LT2 via a clocked inverter circuit 19d controlled by clock signals /CL, CL. The latch circuit LT2 is composed of inverter circuits 19e, 19f. The latch circuit LT2 outputs the spare column bank select signal SCBS at its output terminal. The output terminal of the latch circuit LT2 is connected to one input terminal of a NAND circuit 19h via a constantly conducting transfer gate 19g and to one input terminal of a NAND circuit 19j via an inverter circuit 19i. A multibank write signal MBW is supplied to the other input terminals of the NAND circuits 19h, 19j via an inverter circuit 19k. Inverter circuits 19l, 19m are connected directly to the output terminal of the NAND 19h. Inverter circuits 19n, 19o are connected directly to the output terminal of the NAND circuit 19j. The inverter circuit 19m outputs a column-directional bank select signal CBS0 at its output terminal. The inverter circuit 19o outputs a column-directional bank select signal CBS1 at its output terminal.

In the CBS latch circuit 19 of the above configuration, the column-directional bank designation signal CBS is latched in the latch circuits LT1, LT2 in sequence according to the clock signals CL, /CL. In a normal operation, the multibank write signal MBW is set low. As a result, the column-directional bank select signals CBS0, CBS1 are set high or low complementarily according to the level of the column-directional bank designation signal CBS.

On the other hand, in the test mode, the multibank write signal MBW is set high. As a result, the column-directional bank select signal CBS0, CBS1 are set high, regardless of the level of the column-directional bank designation signal CBS. The column-directional bank select signals CBS0, CBS1 of high level makes all the banks selectable.

Additionally, as mentioned later, in the test mode, the level of the column-directional bank designation signal CBS in inputting a write command is set at the low level when the data is written into the memory cells connected to the normal column lines and is set at the high level when the data is written into the memory cells connected to the spare column lines. Therefore, when the data is written into the memory cells connected to the spare column lines, the spare column bank select signal SCBS goes high.

Figure 5:
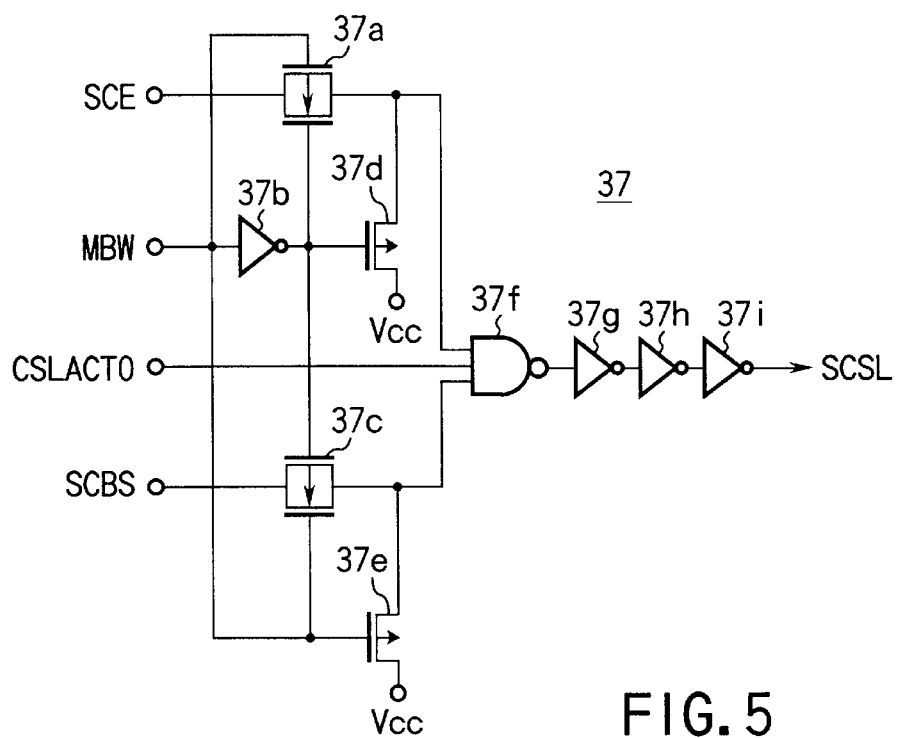
FIG. 5 is a circuit diagram of the spare column decoder of FIG. 1.

FIG. 5 shows the configuration of the spare column decoder 37. The spare column decoder 38 has the same configuration as in FIG. 5. The spare column enable signal SCE output from the spare column selector 35 is supplied to a NAND circuit 37f via a transfer gate 37a. The transfer gate 37a is controlled by the multibank write signal MBW, and an inverted signal of the multibank write signal MBW by an inverter circuit 37b. The output signal of the inverter circuit 37b is supplied to the gate of a p-channel MOS transistor 37d. One end of the current path of the transistor 37d is connected to the output terminal of the transfer gate 37a and the other end is connected to a power supply Vcc.

The spare column bank select signal SCBS output from the CBS latch circuit 19 is supplied to the NAND circuit 37f via a transfer gate 37c. The transfer gate 37c is controlled complementarily with the transfer gate 37a by the multibank write signal MBW and an inverted signal of the multibank write signal MBW by the inverter circuit 37b. The output terminal of the transfer gate 37c is connected to one end of the current path of a p-channel MOS transistor 37e. The other end of the current path of the transistor 37e is connected to the power supply Vcc. The multibank write signal MBW is supplied to the gate of the transistor 37e.

The timing signal CSLACT0 output from the CSL pulse generator 32 is supplied to the input terminal of the NAND circuit 37f. Inverter circuits 37g, 37h, 37i are connected in series to the output terminal of the NAND circuit 37f. The inverter 37i outputs a spare column select signal SCSL at its output terminal.

In the spare column decoder 37 of the above configuration, the multibank write signal MBW is at the low level in a normal operation. As a result, the transfer gate 37a is on, the transfer gate 37c is off, the transistor 37d is off, and the transistor 37e is on. The spare column enable signal SCE is at the low level when there is no replacement of a defective column with a spare column and is at the high level when the defective column is replaced with a spare column. With the timing signal CSLACT0 at the high level, when the spare column enable signal SCE goes high, the spare column selection signal SCSL goes high, thereby selecting a spare column.

In the test mode, when the multibank write signal MBW goes high, the transfer gate 37a turns off, transfer gate 37c turns off, transistor 37d turns on, and transistor 37e turns off. As a result, in the test mode, the spare column select signal SCSL goes high according to the spare column bank select signal SCBS to select a spare column, thereby selecting a spare column.

Figure 6:
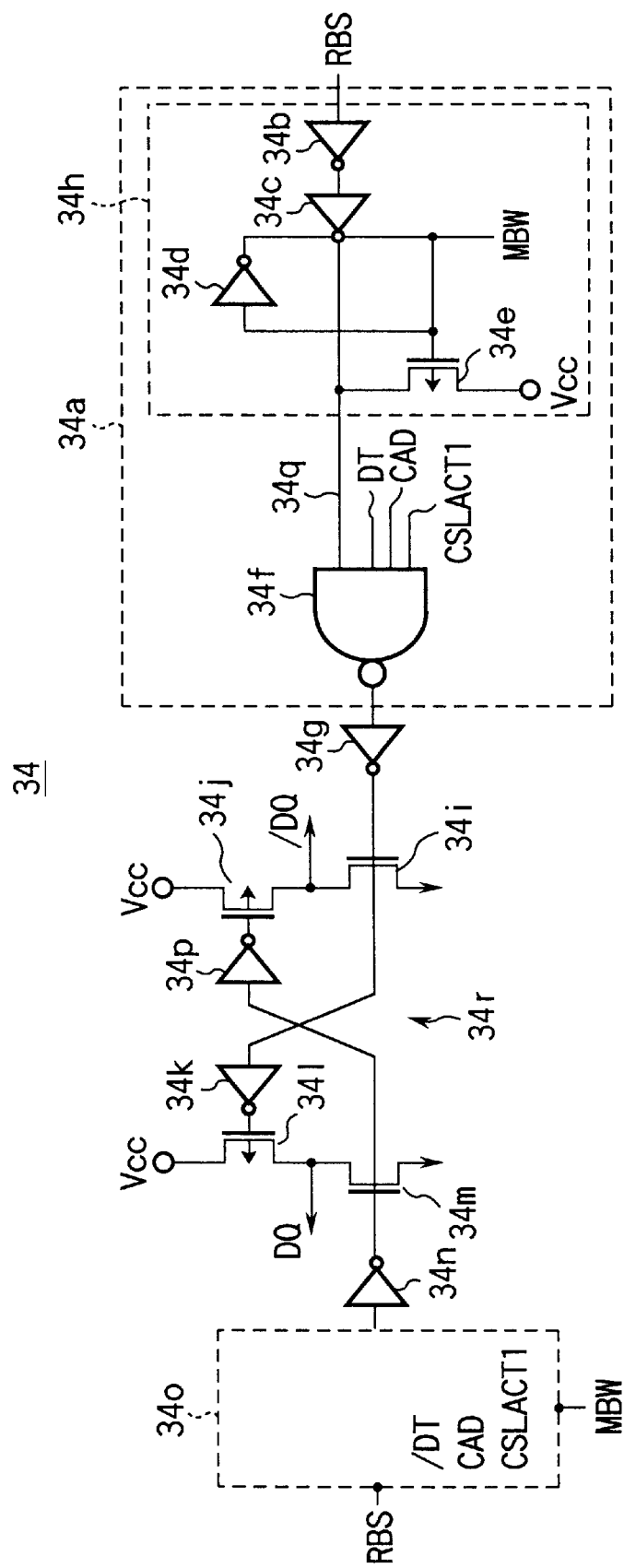
FIG. 6 is a circuit diagram of the write driving circuit of FIG. 1.

FIG. 6 shows the configuration of the write driving circuit 34. The write driving circuit 34 has a control circuit 34a for controlling the operation of the write driving circuit in the test mode. In the control circuit 34a, the row-directional bank designation signal RBS from the row predecoder 24 is supplied to the input terminal of a NAND circuit 34f via an inverter circuit 34b and a clocked inverter circuit 34c. The clocked inverter circuit 34c is controlled by the multibank write signal MBW and the multibank write signal MBW reversed by an inverter circuit 34d. The output terminal of the clocked inverter circuit 34c is connected to the power supply Vcc via a p-channel MOS transistor 34e. The multibank write signal MBW is supplied to the gate of the transistor 34e. The write data DT, column address CAD, and timing signal CSLACT1 are supplied to the input terminal of the NAND circuit 34f.

The output terminal of the NAND circuit 34f is connected via an inverter circuit 34g to the gate of an n-channel MOS transistor 34i constituting a driving circuit 34. One end of the current path of the transistor 34i is connected to the ground and the other end is connected to the data line /DQ and one end of the current path of a p-channel MOS transistor 34j. The power supply Vcc is supplied to the other end of the transistor 34j. The gate of the transistor 34i is connected via an inverter 34k to the gate of a p-channel MOS transistor 34l. The power supply Vcc is supplied to one end of the current path of the transistor 34l. The other end of the current path is connected to the data line DQ and to the ground via an n-channel MOS transistor 34m. The output signal of a control circuit 34o is supplied to the gate of the transistor 34m via an inverter circuit 34n and to the gate of the transistor 34j via an inverter circuit 34p. The control circuit 34o has the same configuration as that of the control circuit 34a (except for data DT; inverted signal /DT is supplied instead of DT). The write driving circuit of FIG. 6 is a circuit corresponding to bank BK1. In the case of the write driving circuit connected to bank BK0, the inverter circuit 34b is not necessary.

With the above configuration, in a normal operation, because the multibank write signal MBW is at the low level and the transistor 34e is on, node 34q is at the high level. As a result, the NAND circuit 34f outputs data DT at its output terminal according to the column address CAD and timing signal CSLACT1. The output signal of the NAND circuit 34f is supplied to the driving circuit 34r via the inverter circuit 34g.

In accordance with the output from control circuit 34o, the driving circuit 34r drives the data line pair DQ, /DQ.

In the test mode, the multibank write signal MBW is high and the transistor 34e is off. According to the multibank write signal MBW, the clocked inverter circuit 34c is activated. As a result, in the test mode, the level of node 34q varies according to the row-directional bank designation signal RBS. Specifically, when a bank is selected, the row-directional bank designation signal RBS is high, placing node 34q at the high level. In other words, if the bank is selected, i.e., the row-directional bank designation signal RBS of high level is supplied to the bank, control circuit 34a output a signal corresponding to data DT through line DQ, while control circuit 34o outputs a signal corresponding to data /DT through line /DQ.

In contrast, when the bank is not selected, that is, when the multibank write signal is high but row-directional bank designation signal is low, node 34q is set at the low level whereby the output terminal of inverter circuit 34g is at low level. Thus, the transistors 34i and 34k is OFF, and an output signal from control circuit 34o through 34n is at low level. As a result, no currents pass data line pair DQ and /DQ from power supply Vcc, in other words, driving circuit 34r does not operate.

As described above, for example, when a bank active command to activate a bank is lost, the row-directional bank designation signal RBS goes low, preventing the write driving circuit corresponding to the deactivated bank from operating, which reduces the drawn current.

With the above configuration, the operation in the test mode of FIG. 1 will be described by reference to FIG. 7. In this example, the latency is 3 and the burst length is 4. The synchronous DRAM allows the chip enable signal CE, row address strobe signal /RAS, column address strobe signal /CAS, and write enable signal /WE to be combined in arbitrary sequence to set a desired command in addition to the commands set in the system. In the embodiment, in the test mode, a multibank write (MBW) command obtained by combining the chip enable signal CE, row address strobe signal /RAS, column address strobe signal /CAS, and write enable signal /WE is used. These commands, row address, column address, and column-directional bank designation signal CBS are supplied from the pads according to the clock signals CLK.

Specifically, a multibank write (MBW) command (COM), which is a combination of the chip enable signal CE, row address strobe signal /RAS, column address strobe signal /CAS, and write enable signal /WE, is supplied together with a clock pulse functioning as a reference for determining the multibank (MBW) mode entry to the mode set register 20. In addition, a command address (COMAD) is supplied to the pad 11. The mode set register 20 sets the multibank write signal MBW at the high level according to the supplied command.

Thereafter, in response to a clock signal corresponding to bank active to activate bank BK0, a command and row address (ROW) are supplied to the mode set register 20 and pad 12. The row address is supplied to the row predecoder 24 via the input buffers 14 and row address latch circuit 17. The row-directional bank designation signal RBS is contained in the most-significant bit of the row address. The decode output signal from the row predecoder 24 is supplied to the row decoder 26 in bank BK0. The row decoder 26 activates the selected word line WL in the memory cell array 39.

Similarly, in response to the clock signal assigned to bank active to activate bank BK1, the command and row address (ROW) are supplied to the mode set register 20 and pad 12. The row address is supplied to the row predecoder 25 via the input buffer 14 and row address latch circuit 17. The decode output signal of the row predecoder 25 is supplied to the row decoder 27 in bank BK1. The row decoder 27 activates the selected word line WL in the memory cell array 40. In the example, although neither bank BK2 nor bank BK3 is shown, the selected word lines in banks BK2 and BK3 are activated sequentially. After the word lines in all the banks have been activated in this way, a column address is supplied.

Specifically, according to the clock signal defined as a write command, the column address (COL) is supplied to the mode set register 20 and pad 12 and the data DT is supplied to the pad 13. The column address is supplied via the input buffer 14 to the CBS latch circuit 19 and column address latch circuit 18. The column address latch circuit 18, according to an internally generated column address signal COL-$AD_{Latch}$, latches the column address. According to the clock signal supplied from the first clock generator 21, the counter 19 of the column address latch circuit 18 increments the latched column address and supplies the result to the column predecoders 28, 29 and spare column selectors 35, 36. As described above, when the multibank write signal MBW is high, the CBS latch circuit 19 outputs the high column-directional bank select signals CBS0, CBS1 and the high spare column bank select signal SCBS. The column-directional bank select signal CBS0 is supplied to the column predecoder 28 and the spare column selector 35. The column-directional bank select signal CBS1 is supplied to the column predecoder 29 and spare column selector 36.

The column predecoders 28, 29 are activated according to the column-directional bank select signals CBS0, CBS1, predecode the column address supplied from the column address latch circuit 18, and supply the result to the column decoders 30, 31 in each bank. The spare column selectors 35, 36 are also activated according to the column-directional bank select signals CBS0, CBS1, generate a spare column enable signal SCE according to the column address supplied from the column address latch circuit 18, and supply the result to the spare column decoders 37, 38 in each bank. According to the clock signal supplied from the input buffer 15, the CSL pulse generator 32 outputs the timing signals CSLACT0 and CSLACT1 sequentially to control the timing of outputting the column select signal and supplies them to the column decoders 30, 31 and spare column decoders 37, 38 in each bank. Each of the column decoders 30, 31 outputs the column select signal CSL sequentially according to the timing signal CSLACT0 or CSLACT1. Each of the spare decoders 37, 38 outputs the spare column signal SCSL to select a spare column, according to the timing signal CSLACT0 or CSLACT1.

As described above, the columns in each bank are selected in sequence and the data DT latched in the data latch circuit 23 is supplied to the write driving circuits 33, 34. The write driving circuits 33, 34 drive the data line pair DQ, /DQ according to the data DT and write the data into the memory cells in the selected column. By repeating the operation, the data is written simultaneously into the memory cells in all the banks. Thereafter, a multibank write exit command is supplied to complete the test mode. The multibank write exit command is a combination of the chip enable signal CE, row address strobe signal /RAS, column address strobe signal /CAS, write enable signal /WE, and address signal.

With the embodiment, in a state where the word lines in the individual banks are activated in the test mode, corresponding column lines in the individual banks are selected simultaneously, thereby writing the data into all the banks simultaneously. As a result, the write time can be shortened, which shortens the time required for test.

Furthermore, in the embodiment, a bank is not selected by the column-directional bank designation signal CBS in the column address in the test mode. Specifically, because all the banks are selected to write the data into all the banks, the column-directional bank designation signal CBS need not be used. Therefore, the signal CBS can be used to select a spare column and write the data into the selected spare column. Consequently, since the spare columns can be tested before the defective column is replaced with a spare column by cutting the fuse as in the prior art, the yield can be improved.

Moreover, the column-directional bank designation signal is used to select a spare column. Therefore, pins for supplying extended addresses to select spare columns are not needed, which prevents the chip size from getting large.

Furthermore, when the row-directional bank designation signal RBS assigned to the most significant bit in the row address is at the low level in the test mode, the write driving circuits 33, 34 are deactivated. Therefore, for example, when the bank active command to activate a bank has been lost in the test mode, the row-directional bank designation signal RBS goes low, preventing the write driving circuit corresponding to the deactivated bank from operating, which reduces the drawn current.

In addition, the multibank write exit command is supplied to complete the test mode. The multibank write exit command is a combination of the chip enable signal CE, row address strobe signal /RAS, column address strobe signal /CAS, write enable signal /WE, and address signal. Therefore, the power supply need not be turned off to complete the test mode, which shortens the total testing time.

While in the embodiment, a spare column has been selected in the test mode, a spare row may be selected instead. In this case, a command to select a spare row is supplied to the mode set register 20 on the basis of a combination of the aforementioned various signals to set the test mode for spare rows. In this state, a spare row is accessed and the data is written into the spare row. For example, as shown in FIG. 8, assume a case where a spare row (a spare word line) SWL is provided at one end of the memory cell array MCA and a spare row decoder SPR/D is provided adjacent to a row decoder R/D, means for selecting the spare row SWL. In such a case, a bit less significant than the bit of RBS may be assigned to the spare row SWL, the spare row SWL may set at the low level in the unselected state.

Figure 9:
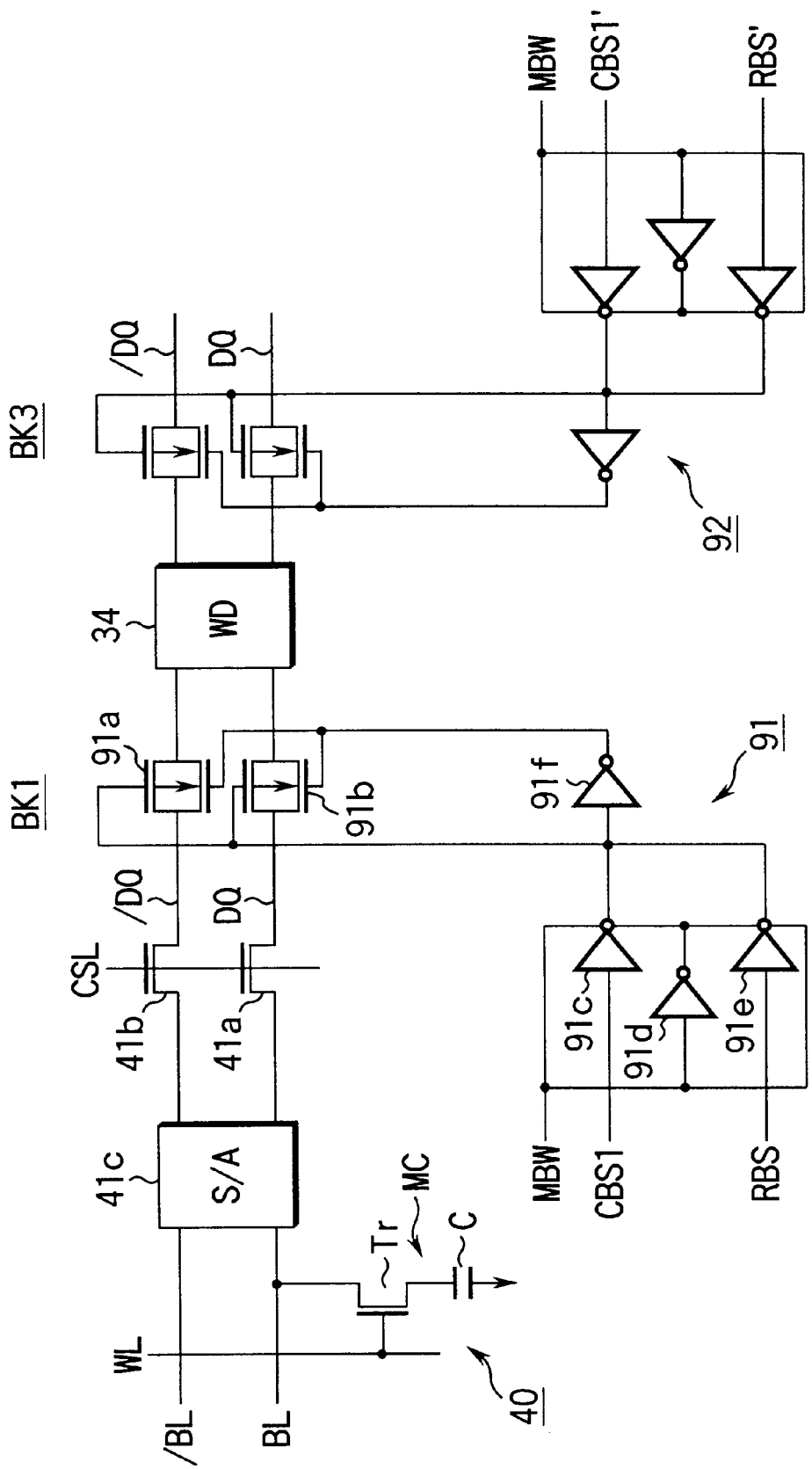
FIG. 9 shows a circuit diagram of another arrangement of memory cells and a write driving circuit according to the present invention.

FIG. 9 shows another example of FIG. 3. In FIG. 9, the same parts as those of FIG. 3 are indicated by the same reference symbols. In the example of FIG. 3, the write driving circuit has been provided for each bank. In the example of FIG. 9, however, a write driving circuit is shared by two adjacent banks.

Between a write driving circuit 34 and the data lines /DQ, DQ in bank BK1, a first control circuit 91 for connecting the write driving circuit 34 to the data lines /DQ, DQ is provided. Between the write driving circuit 34 and the data lines /DQ, DQ in bank BK3, a second control circuit 92 for connecting the write driving circuit 34 to the data lines /DQ, DQ is provided. The first and second control circuits 91 and 92 have the same configuration. In the second control circuit 92, the same parts as those in the first control circuit 91 are indicated by the same reference symbols. Only the configuration of the first control circuit 91 will be explained.

Between the write driving circuit 34 and the data lines /DQ, DQ, the transfer gates 91a, 91b are connected. The transfer gates 91a, 91b are controlled by the multibank write signal MBW supplied from the mode set register 20, the column-directional bank select signal CBS1 supplied from the CBS latch circuit 19, and the row-directional bank designation signal RBS supplied from the row predecoder 25. Specifically, the column-directional bank select signal CBS1 is supplied to the input terminal of a clocked inverter circuit 91c. The clocked inverter circuit 91c is controlled by the multibank write signal MBW and the multibank write signal MBW reversed by an inverter circuit 91d. The row-directional bank designation signal RBS is supplied to the input terminal of the clocked inverter circuit 91e. The clocked inverter circuit 91e is controlled by the multibank write signal MBW and the multibank write signal MBW reversed by the inverter circuit 91d. The output terminals of the clocked inverter circuits 91c, 91e are connected to the gates of the p-channel MOS transistors constituting the transfer gates 91a, 91b and via an inverter circuit 91f to the gates of the n-channel MOS transistors constituting the transfer gates 91a, 91b.

The second control circuit 92 differs from the first control circuit 91 in the input signals. Specifically, a column-directional bank select signals CBS1' and row-directional bank designation signal RBS' to select bank BK3 are supplied to the second control circuit 92.

In the first and second control circuits 91, 92, because MBW is low in a normal operation, the clocked inverter circuit 91c is activated and the clocked inverter circuit 91e is deactivated. As a result, the first and second control circuits 91, 92 are operated according to the column-directional bank select signals CBS1, CBS1', respectively.

On the other hand, because MBW goes high in the test mode, the clocked inverter circuit 91e is activated and the clocked inverter circuit 91c is deactivated. As a result, the first and second control circuits 91, 92 are operated according to the row-directional bank designation signals RBS, RBS', respectively. Specifically, according to the row-directional bank designation signals RBS, RBS', the transfer gates 91a, 91b in the banks BK1, BK3 turn on at the same time, thereby causing the writing driving circuit 34 to write the data in the memory cells in the banks BK1, BK3 at the same time.

With the circuit configuration of FIG. 9, when the bank active command to activate a bank in the test mode is lost, the bank select signal RBS (RBS') goes low, disconnecting the write driving circuit from the deactivated bank, which reduces the drawn current. Consequently, the circuitry enclosed by a broken line 34h in FIG. 6 is unnecessary.

The present invention is not restricted to the above embodiment and may be modified or embodied in still other ways without departing from the spirit or essential character thereof.

As described above, with the present invention, it is possible to provide a semiconductor memory device capable of not only testing the spare cells to improve the yield, but also shortening the testing time by testing plural banks simultaneously with a smaller drawn current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a plurality of banks each comprising:
   a memory cell array including word lines, column lines, and at least one spare column line;
   a row decoder for selecting one of said word lines according to a row address;
   a column decoder for selecting one of said column lines according to a column address;
   a spare column decoder for selecting one of said at least one spare column;
   a first control signal generating circuit for generating a write control signal for bringing the banks into a writing state simultaneously according to a signal for setting a test mode;
   a second control signal generating circuit for latching a column-directional bank designation signal included in the column address, for generating a first selection signal for selecting said spare column decoders in the banks, and for generating a second selection signal for selecting all of said column decoders in all the banks according to the write control signal supplied from said first control signal generating circuit; and
   at least one write driver circuit for writing data onto a memory cell of a column line selected according to said column address by the column decoders selected by the second selection signal supplied from said second control signal generating circuit, and for writing data onto a memory cell of a spare column line via the spare column decoder selected by the first select signal supplied from said second control signal generating circuit.

2. The semiconductor memory device according to claim 1, wherein said write driver circuit includes a write control circuit for deactivating said write driver circuit when a row-directional bank designation signal included in said row address represents an unselected state in the test mode.

3. The semiconductor memory device according to claim 2, wherein:
   said write control circuit comprises:
   a clocked inverter circuit having an input terminal supplied with said row-directional bank designation signal, and being activated according to said write control signal;
   a transistor coupled to an output terminal of said clocked inverter circuit, for setting the output terminal of said clocked inverter circuit at one logic level potential when said write control signal is inactive; and a logic circuit coupled to the output terminal of said clocked inverter circuit, for controlling the transfer of data in accordance with the logic level of the output terminal of the clocked inverter circuit.

4. The semiconductor memory device according to claim 2, wherein said write driver circuit is shared by two adjacent banks.

5. The semiconductor memory device according to claim 1, wherein said spare column decoder comprises a selection circuit which is activated according to said write control signal supplied from said first control signal generating circuit and which selects one of said at least one spare column according to said first selection signal supplied from said second control signal generating circuit.

6. The semiconductor memory device according to claim 1, wherein said first control signal generating circuit sets the write control signal for bringing said banks simultaneously in the writing state at an inactive level, according to a signal for ending the test mode.

7. The semiconductor memory device according to claim 2, wherein said plurality of banks each further comprise:
one or more spare row lines;
a spare row decoder connected to said spare row lines, for selecting one of said spare row lines in accordance with said row address;
wherein:
said row address includes a bit representing spare row selection information.

8. A semiconductor memory device comprising:
an address buffer for receiving and storing address supplied from an external address source;
a data buffer for receiving and storing data from an external data source;
one or more memory cell arrays each comprising:
a plurality of row lines;
a plurality of column lines arranged to intersect said row lines;
at least one spare column line arranged to intersect said row lines;
a plurality of memory cells coupled to said row lines, said column lines and said at least one spare column line at intersections thereof;
a row decoder connected to said plurality of row lines;
a column decoder connected to said plurality of column lines;
a spare column decoder connected to said at least one spare column line; and
a write driver connected to said column lines and said spare column line, for writing information data supplied from said data buffer into a selected memory cell;
a row line selection circuit having an input terminal connected to said address buffer, and having an output terminal coupled to said row decoder and said write driver;
a mode set register having a first input terminal connected to said address buffer and a second input terminal supplied with a mode set command, for generating a write control signal in a test mode;
a column line selection circuit having a first input terminal connected to said address buffer, a second input terminal connected to said mode set register, and a first output terminal connected to said column decoder and said write driver; and a spare column line selection circuit having a first input terminal coupled to said address buffer, a second input terminal coupled to said mode set register, and a first output terminal coupled to said spare column decoder, wherein said column line selection circuit further has a second output terminal connected to spare column line selection circuit, and said spare column line selection circuit further has a second output terminal connected to said column line selection circuit.

9. The semiconductor memory device according to claim 8, wherein said write driver includes a data transfer line pair and a current cut-off circuit, said current cut-off circuit comprising:
a first p-MOS transistor having a current pass connected to a voltage source at one end, and connected to one of said data transfer line pair at the other end;
a first n-MOS transistor having a current pass connected to the other end of the current pass of said p-MOS transistor to one end, and connected to the ground at the other end;
a second p-MOS transistor having a current pass connected to said voltage source at one end, and connected to the other of said data transfer line pair at the other end;
a second n-MOS transistor having a current pass connected to the other end of said second p-MOS transistor at one end, and connected to the ground at the other end;
a first write operation control circuit connected to the gate of said first p-MOS transistor through a first inverter, the gate of said second n-MOS transistor, and a second inverter, sequentially, for controlling the operation said write driver in test mode; and
a second write operation control circuit connected to the gate of said second p-MOS transistor through a third inverter, the gate of said first n-MOS transistor, and a fourth inverter, sequentially, for controlling the operation said write driver in test mode.

10. The semiconductor memory device according to claim 9, wherein said first and second write operation control circuits each comprises:
a clocked inverter circuit being connected to said mode set register, and being activated according to said write control signal;
a transistor having a current pass connected to the output terminal of said clocked inverter circuit and connected to the voltage source at the other end, and having a gate terminal supplied with said write control signal; and
a logic circuit having an input terminal coupled to the output terminal of said clocked inverter circuit, and having an output terminal connected to one of said data transfer line pair for transferring data to a selected memory cell.

11. The semiconductor memory device according to claim 8, wherein said spare column line selection circuit includes a CBS latch circuit connected to said mode set register and said address buffer, for generating a spare column bank selection signal and a spare column selector connected to said CBS latch circuit and said spare column decoder, said CBS latch circuit comprising:
a first clocked inverter circuit having an input terminal supplied with a column-direction bank selection signal included in a column address;
a first latch circuit connected to the output terminal of said first clocked inverter circuit;

a second clocked inverter circuit connected to the output of said first latch circuit;

a second latch circuit connected to the output terminal of said second clocked inverter circuit;

an output electrode connected to the output terminal of said second latch circuit, for supplying a spare column bank selection signal to said spare column decoder; and a NAND gate circuit having two input terminals connected to the output terminal of said second latch circuit and the output terminal of an inverter circuit receiving said write control signal, respectively, and having an output terminal connected to said spare column line selection circuit.

12. The semiconductor memory device according to claim 8, wherein said spare column decoder comprises:

a first input terminal for receiving a spare column activation signal from said spare column selector;

a second input terminal for receiving said write control signal from said mode set register;

a third input terminal for receiving said spare column bank selection signal from said CBS latch circuit;

a first transfer gate having a current pass connected to said first input terminal at one end;

a second transfer gate having a current pass connected to said third input terminal at one end;

an inverter circuit having an input terminal connected to said second input terminal;

a first p-MOS transistor having a current pass connected to the voltage source at one end, and connected to the other end of the current pass of said first transfer gate, and having a gate terminal connected to the output terminal of said inverter circuit;

a second p-MOS transistor having a current pass connected to the voltage source at one end, and connected to the other end of the current pass of said second transfer gate, and having a gate terminal connected to said second input terminal;

a NAND gate circuit having two input terminals connected to the other end of current pass of said first transfer gate, and the other end of current pass of said second transfer gate, respectively, wherein the p-channel gate of said first transfer gate and the n-channel gate of said second transfer gate are connected to said second input terminal, and the n-channel gate of said first transfer gate and the p-channel gate of said second transfer gate are connected to the output terminal of said inverter circuit.

13. A synchronous dynamic random access memory having a normal mode and a test mode, comprising:

a mode set circuit for generating a test mode signal in the test mode;

a plurality of banks each having a plurality of memory cells arranged in a matrix comprised of a plurality of rows and a plurality of columns including at least one spare column;

a row selection circuit for selecting one of said rows in response to a row address in the normal mode, and for selecting all of said rows responsive to said test mode signal in the test mode;

a column selection circuit for selecting one of said banks to activate all of the columns sequentially in said selected bank, responsive to a column address in the normal mode, and for selecting all of said banks to activate the columns in the banks, responsive to said test mode signal in the test mode;

a spare column selection circuit for selecting one of said at least one spare column responsive to a column address in the normal mode, and for selecting all of said at least one spare column sequentially in response to the test mode signal in the test mode; and at least one data writing circuit for writing data into a selected memory cell in the normal mode, and writing test data into all of the memory cells in response to said test mode signal in the test mode.

14. The synchronous dynamic random access memory according to claim 13, wherein said data writing circuit includes a write operation control circuit for inactivating said data writing circuit in the test mode when the bank corresponding to said data writing circuit is in unselected state.

* * * * *